United States Patent
Chang et al.

(10) Patent No.: US 9,583,680 B2
(45) Date of Patent: Feb. 28, 2017

(54) TRANSPARENT CONDUCTIVE STRUCTURE, DEVICE COMPRISING THE SAME, AND THE MANUFACTURING METHOD THEREOF

(71) Applicant: EPISTAR CORPORATION, Hsinchu (TW)

(72) Inventors: Yung-Fu Chang, New Taipei (TW); Meng-Chyi Wu, Hsinchu (TW); Chong-Long Ho, Taoyuan (TW); Ai-Sen Liu, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 14/939,458

(22) Filed: Nov. 12, 2015

(65) Prior Publication Data
US 2016/0064616 A1 Mar. 3, 2016

Related U.S. Application Data

(62) Division of application No. 13/970,732, filed on Aug. 20, 2013, now abandoned.
(Continued)

(51) Int. Cl.
*H01L 33/44* (2010.01)
*H01L 33/42* (2010.01)
(Continued)

(52) U.S. Cl.
CPC ........ *H01L 33/44* (2013.01); *H01L 31/02963* (2013.01); *H01L 31/022483* (2013.01); *H01L 31/1844* (2013.01); *H01L 31/1884* (2013.01); *H01L 33/06* (2013.01); *H01L 33/32* (2013.01); *H01L 33/42* (2013.01); *H01L 2933/0025* (2013.01); *Y02E 10/544* (2013.01); *Y02P 70/521* (2015.11)

(58) Field of Classification Search
CPC .......... H01L 31/00; H01L 33/42; H01L 33/44
USPC .......................................................... 257/98
See application file for complete search history.

(56) References Cited

U.S. PATENT DOCUMENTS 6,501,014 B1   12/2002   Kubota et al.
7,355,210 B2 *  4/2008   Ou ........................ H01L 33/32
                                                        257/91
(Continued)

OTHER PUBLICATIONS

Makino et al., Heat Resistance of Ga-Doped ZnO Films Deposited by Ion-Plating With DC-ARC Discharge: Impact of O2 Flow Rate During Deposition, IEEE, 2010, pp. 002459-002462.*
(Continued)

*Primary Examiner* — Earl Taylor
(74) *Attorney, Agent, or Firm* — Muncy, Geissler, Olds & Lowe, P.C.

(57) ABSTRACT

An optical electrical device comprises a base and a transparent conductive structure on the base is disclosed. The base further comprises a light-emitting device and the transparent conductive structure comprises a transparent conductive oxide layer and a passivation layer on the transparent conductive oxide layer. The material of the transparent conductive oxide layer comprises transparent conductive metal oxide, such as ZnO. Furthermore, the transparent conductive metal oxide also comprises impurities, such as a carrier e.g. gallium.

20 Claims, 11 Drawing Sheets

Related U.S. Application Data

(60) Provisional application No. 61/755,514, filed on Jan. 23, 2013.

(51) Int. Cl.
*H01L 31/0224* (2006.01)
*H01L 31/0296* (2006.01)
*H01L 31/18* (2006.01)
*H01L 33/06* (2010.01)
*H01L 33/32* (2010.01)

(56) References Cited

U.S. PATENT DOCUMENTS

| | | | | |
|---|---|---|---|---|
| 7,385,226 B2* | 6/2008 | Ou | H01L 33/22 | 257/91 |
| 7,491,979 B2* | 2/2009 | Kwak | H01L 33/405 | 257/79 |
| 7,696,524 B2* | 4/2010 | Ikeda | G09G 3/3291 | 257/640 |
| 8,115,224 B2* | 2/2012 | Kim | H01L 33/382 | 257/79 |
| 8,207,005 B2* | 6/2012 | Weidman | G01T 1/2018 | 257/E21.135 |
| 8,222,740 B2 | 7/2012 | Narayan | | |
| 8,593,055 B2* | 11/2013 | Tchakarov | H01L 51/5212 | 257/89 |
| 8,624,279 B2* | 1/2014 | Tseng | H01L 33/32 | 257/103 |
| 8,637,334 B2* | 1/2014 | Thompson | H01L 33/14 | 257/103 |
| 8,723,203 B2* | 5/2014 | Choi | H01L 33/38 | 257/100 |
| 8,778,448 B2* | 7/2014 | Hekmatshoar-Tabari | H01L 31/03762 | 427/74 |
| 9,006,566 B2* | 4/2015 | Ihama | H01L 27/14621 | 136/263 |
| 2005/0211995 A1* | 9/2005 | Ou | H01L 33/32 | 257/80 |
| 2005/0285136 A1* | 12/2005 | Ou | H01L 33/22 | 257/103 |
| 2008/0054278 A9* | 3/2008 | Ou | H01L 33/22 | 257/95 |
| 2008/0105890 A1* | 5/2008 | Kwak | H01L 33/405 | 257/98 |
| 2008/0280119 A1* | 11/2008 | Kishimoto | C23C 14/086 | 428/220 |
| 2009/0152583 A1* | 6/2009 | Chen | H01L 33/382 | 257/98 |
| 2009/0267098 A1* | 10/2009 | Choi | H01L 33/20 | 257/98 |
| 2010/0051981 A1* | 3/2010 | Osawa | H01L 33/42 | 257/98 |
| 2010/0052000 A1* | 3/2010 | Ko | H01L 33/382 | 257/98 |
| 2010/0089623 A1* | 4/2010 | Jang | C03C 17/3417 | 174/257 |
| 2010/0127285 A1* | 5/2010 | Jeong | H01L 33/0079 | 257/94 |
| 2010/0148199 A1* | 6/2010 | Kim | H01L 33/44 | 257/98 |
| 2010/0181586 A1* | 7/2010 | Kim | H01L 33/382 | 257/98 |
| 2011/0001153 A1* | 1/2011 | Tchakarov | H01L 51/5212 | 257/98 |
| 2011/0001420 A1* | 1/2011 | Tchakarov | H01L 51/5212 | 313/355 |
| 2011/0018022 A1* | 1/2011 | Okabe | H01L 33/405 | 257/98 |
| 2011/0018024 A1* | 1/2011 | Fukshima | H01L 33/387 | 257/98 |
| 2011/0062479 A1* | 3/2011 | Sugano | H01L 33/0095 | 257/98 |
| 2011/0108868 A1* | 5/2011 | Son | H01L 33/06 | 257/98 |
| 2011/0183458 A1* | 7/2011 | Weidman | G01T 1/2018 | 438/71 |
| 2011/0197956 A1* | 8/2011 | Chang | H01L 31/03524 | 136/255 |
| 2011/0227112 A1* | 9/2011 | Choi | H01L 33/38 | 257/98 |
| 2012/0017995 A1* | 1/2012 | Pschirer | H01L 51/0059 | 136/263 |
| 2012/0040490 A1* | 2/2012 | Gallazzo | H01L 31/02242 | 438/87 |
| 2012/0040494 A1* | 2/2012 | Yamaguchi | C23C 14/0036 | 438/98 |
| 2012/0073647 A1* | 3/2012 | Stangl | H01L 31/02244 | 136/256 |
| 2012/0100666 A1* | 4/2012 | Gee | H01L 21/67706 | 438/98 |
| 2012/0285518 A1* | 11/2012 | De Souza | H01L 31/0682 | 136/255 |
| 2012/0305060 A1* | 12/2012 | Fu | H01L 31/0747 | 136/255 |
| 2012/0326169 A1* | 12/2012 | Sakai | B82Y 20/00 | 257/79 |
| 2013/0019944 A1* | 1/2013 | Hekmatshoar-Tabari | H01L 31/03762 | 136/258 |
| 2013/0019945 A1* | 1/2013 | Hekmatshoar-Tabari | H01L 31/03762 | 136/258 |
| 2013/0118559 A1* | 5/2013 | Castillo | H01L 31/0504 | 136/251 |
| 2013/0153015 A1* | 6/2013 | Lee | H01L 31/0392 | 136/256 |
| 2013/0181241 A1* | 7/2013 | Meulen | H01L 51/52 | 257/98 |
| 2013/0307007 A1* | 11/2013 | Choi | H01L 33/405 | 257/98 |
| 2014/0170806 A1* | 6/2014 | Van Duren | H01L 31/02246 | 438/96 |
| 2014/0174525 A1* | 6/2014 | Wu | H01L 31/02245 | 136/256 |
| 2014/0203322 A1* | 7/2014 | Chang | H01L 33/42 | 257/99 |
| 2016/0064616 A1* | 3/2016 | Chang | H01L 33/44 | 438/38 |

OTHER PUBLICATIONS

Change et al., "Effects of Passivation Layer and Post-Annealing on Ga-Doped ZnO Films Grown by ALD", ECS Journal of Solid State Science and Technology, 2, (6), 2013, pp. N140-N144.

Chung et al., "Investigation on the interface of GZO/ITO double-layered transparent conducting oxide films for solar cells", Journal of Ceramic Processing Research, vol. 13, Special 1, 2012, pp. s10-s15.

Liu et al., "Transparent conducting oxides for electrode applications in light emitting and absorbing devices", Superlattices and Microstructures, 48, 2010, pp. 458-484.

Ou et al., Pulsed laser deposition of ITO/AZO transparent contact layers for GaN LED applications, Optics Express, vol. 19, No. 17, 2011, pp. 16244-16251.

Sheu et al., Ga-Doped ZnO Transparent Conductive Oxide Films Applied to GaN-Based Light-Emitting Diodes for Improving Light Extraction Efficiency, IEEE Journal of Quantum Electronics, vol. 44, No. 12, 2008, pp. 1211-1218.

* cited by examiner

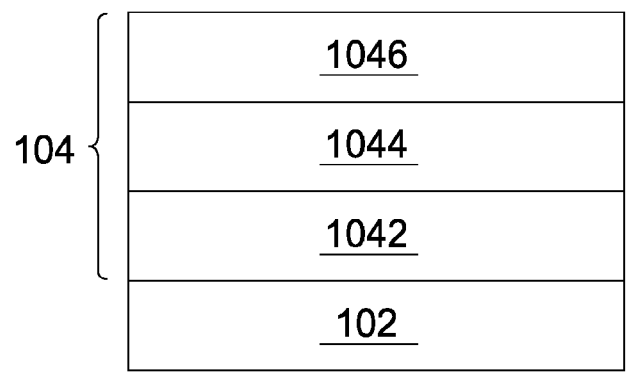
FIG.6(a)
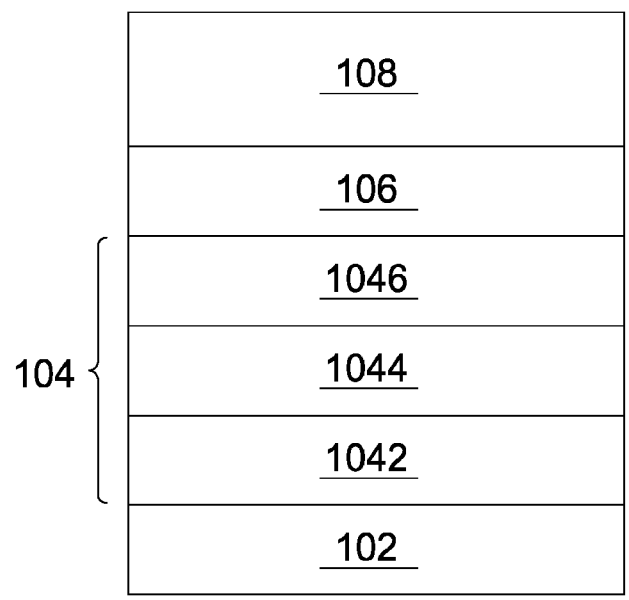
FIG.6(b)
FIG.6(c)

TRANSPARENT CONDUCTIVE STRUCTURE, DEVICE COMPRISING THE SAME, AND THE MANUFACTURING METHOD THEREOF

CROSS REFERENCE TO RELATED APPLICATIONS

This application is a Divisional of co-pending application Ser. No. 13/970,732, filed on Aug. 20, 2013, for which priority is claimed under 35 U.S.C. §120; and this application claims priority of U.S. Provisional Application No. 61/755,514 filed on Jan. 23, 2013 under 35 U.S.C. §119(e), the entire contents of all of which are hereby incorporated by reference

TECHNICAL FIELD

This present application relates to a device comprising a base and a transparent conductive structure on the base and the method of manufacturing thereof.

BACKGROUND OF THE DISCLOSURE

An optical electrical device such as light-emitting diode (LED) of the solid-state lighting elements have the characteristics of low heat generation, long operational life and the light emitted by the LEDs has a stable wavelength range so the LEDs have been widely used in various applications. Efforts have been devoted to the luminance of the LED in order to apply the device to the lighting domain and further achieve the goal of energy conservation and carbon reduction.

Many improvements on structures or materials to enhance the light emitting efficiency of an LED have been realized. One of those improvements is to add an enhanced film to increase light extraction, optic-electrical transition efficiency, contact resistance, forward voltage, or the like. However, the high temperature during manufacturing damages the electrical and/or light properties of the enhanced film, and induces the resistances of the enhanced films increasing and the wavelength of maximum transmittance shifting.

SUMMARY OF THE DISCLOSURE

An optical electrical device comprises a base and a transparent conductive structure on the base is disclosed. The base further comprises a light-emitting device which comprises a first semiconductor layer, an active layer, and a second semiconductor layer. The transparent conductive structure comprises a transparent conductive oxide layer and a passivation layer on the transparent conductive oxide layer. The transparent conductive structure prevents carrier out-diffusion from the base. The material of the passivation layer comprises dielectric material, such as insulating oxide material comprising aluminum oxide and silicon oxide. The material of the transparent conductive oxide layer comprises transparent conductive metal oxide, such as ZnO. Furthermore, transparent conductive metal oxide also comprises impurities, such as a carrier e.g. gallium.

The present disclosure provides a manufacturing method of an optical electrical device comprises steps of providing a base and forming a transparent conductive structure on the base. The step of forming a base further comprises providing a substrate, forming semiconductor layers on the substrate and growing an active layer located between the semiconductor layers. The step of forming a transparent conductive structure further comprises forming a transparent conductive oxide layer on the base and forming a passivation layer on the transparent conductive oxide layer. Moreover, an annealing process is applied after the base and the transparent conductive structure formed.

BRIEF DESCRIPTION OF THE DRAWINGS

FIGS. 6(a)-6(d) show an embodiment of method for forming a device in accordance with the present disclosure;

DETAILED DESCRIPTION OF THE PRESENT DISCLOSURE

Figure 1:
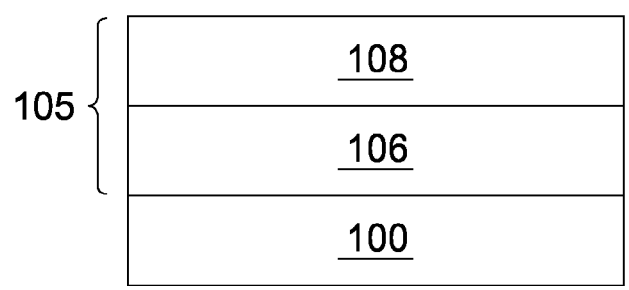
FIG. 1 shows an embodiment of a device having a transparent conductive layer in accordance with the present disclosure.

FIG. 1 shows a device 1 having a transparent conductive structure 105 in accordance with an embodiment of the present disclosure. The device 1 comprises a base 100 and a transparent conductive structure 105 on the base 100. The transparent conductive structure 105 comprises a transparent conductive oxide layer 106 on the base 100 and a passivation layer 108 on the transparent conductive oxide layer 106. The passivation layer 108 prevents a element doped in the transparent conductive oxide layer 106 from diffusing outside the transparent conductive oxide layer 106 by a thermal annealing process applied to the transparent conductive structure 105. In other aspect, the passivation layer 108 prevents a doped element from being oxidized by oxygen and further decreasing the doping concentration of the doped element. The doped element is used to increase conductivity of the transparent conductive oxide layer 106. In other words, part of the doped element induces carriers, such as electron, to improve conductivity of the transparent conductive oxide layer 106. However, the concentration of the doped element is not directly corresponding to the concentration of the carrier induced by the doped element. Since one doped element may induce one or more electrons and not all doped elements induce carriers, the concentration of the carrier is related to the doping concentration. The base 100 can be a substrate only or a substrate having a device structure thereon, wherein the device structure comprises passive and active components. The passive components comprises capacitors and resistors. The active components comprises integrated-circuit structure and photonic-electronic structure comprising a semiconductor light-emitting structure, a semiconductor, a solar cell structure, or combination thereof. The transparent conductive oxide layer 106 comprises metal oxide, such as zinc oxide (ZnO) doped with group IIIA element, e.g. aluminum-doped ZnO (AZO), gallium-doped ZnO (GZO), or indium-doped ZnO (IZO). Furthermore, the mole fraction of the group IIIA element doped is less than 10% of the transparent conductive oxide layer 106. In an embodiment, the mole fraction of the element doped is about 5%. In one embodiment, the base 100 comprises a GaN-based light-emitting structure, and the transparent conductive oxide layer 106 comprises a ZnO-based semiconducting material having a band gap (~3.37 eV) wider than that of GaN-based light-emitting structure and an exciton binding energy (~60 meV) larger than that of GaN-based light-emitting structure. The electrical property of the transparent conductive oxide layer 106 is adjustable by controlling a doping concentration of the element doped in the transparent conductive oxide layer 106. The passivation layer 108 comprises a dielectric material, such as insulating oxide material, e.g. aluminum oxide or silicon oxide. The thickness of passivation layer is about from 50 nm to 300 nm.

The method for manufacturing the device 1 comprises steps of providing the base 100, depositing the transparent conductive oxide layer 106 on the base 100, depositing the passivation layer 108 on the transparent conductive oxide layer 106, and performing a thermal annealing process to the device 1 for annealing the transparent conductive oxide layer 106 in an annealing chamber. The method for depositing the transparent conductive oxide layer 106 comprises atomic layer deposition (ALD), chemical vapor deposition (CVD), sol-gel, or spray pyrolysis. The thermal annealing process comprises rapid thermal annealing (RTA). The method for depositing the passivation layer 108 comprises e-beam coating. In one embodiment, the base 100 comprises GaN-based light-emitting structure, the thermal annealing process is applied to the device 1 for improving the ohmic contact between the interface of the transparent conductive oxide layer 106 and the GaN-based light-emitting structure. The light-emitting structure comprises an n-type semiconductor layer, a p-type semiconductor layer, and a active layer configured to emit a incoherent light.

In one embodiment, the transparent conductive oxide layer 106 comprising Ga-doped ZnO is deposited on the base 100 by thermal-mode ALD with $H_2O$ as an oxidant source. Diethylzinc (DEZ) and triethylgallium (TEG) are used as the precursors for zinc and gallium, respectively, while $H_2O$ is used as the precursor for oxygen or the oxidant source. Argon is used as purge gas and carrier gas during the deposition. The deposition temperature is 325° C. Precursors are sequentially injected with a pulse into the reaction chamber with a carrier gas flow of 200 sccm at the base pressure 0.2 torr. DEZ and $H_2O$ are alternatively injected into the chamber for ZnO deposition, and the recipe for the deposition is repeated in cycles. A few cycles of DEZ is replaced by TEG to dope gallium into ZnO with a ratio of Zn:Ga around 20:1. The method of injecting the precursors such as DEZ, TEG, and $H_2O$ having an interval of a pulsetime and a wait timekept at 0.02 secs and 10 secs. That is, the precursors is injected following a loop of injecting 0.02 secs and stop for 10 secs. The thickness of ALD-deposited transparent conductive oxide layer 106 is between 100 nm and 500 nm.

The thermal annealing process comprising rapid thermal annealing (RTA) for annealing the transparent conductive oxide layer 106 is under conditions of an annealing time of 5 minutes, an annealing temperature range of 300-500° C. for the base 100 being a glass substrate and 400-700° C. for the base 100 being a sapphire substrate. The electrical properties of the transparent conductive oxide layer 108 are characterized by Hall method. Transmittance of the transparent conductive oxide layer 108 is measured by using a visible spectrophotometer.

Figure 2A:
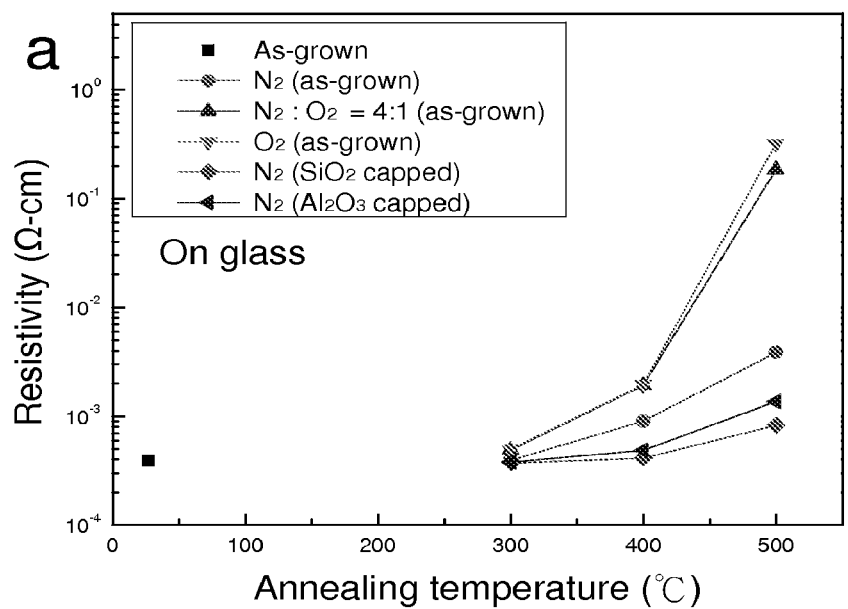
FIGS. 2(a) and 2(b) depict the resistivity of the transparent conductive oxide layer with and without the passivation layer thereon on different base related to the annealing temperature in various ambient in accordance with the present disclosure.

FIG. 2($a$) shows the resistivity of the transparent conductive oxide layer 106 comprising GZO with and without the passivation layer 108 thereon on the base 100 which comprises a glass substrate annealed under various temperature and ambients. That is, different gases are used as a carrier gas in the annealing chamber including nitrogen, oxygen, or the mixture of nitrogen and oxygen with a ratio of 4:1. The transparent conductive oxide layer 106 comprising GZO has a resistivity of $3.9 \times 10^{-4}$ Ω-cm. The thermal annealing process is found deleterious to the conductivity of the transparent conductive oxide layer 106. The resistivity of the transparent conductive oxide layer 106 with the passivation layer 108 thereon and annealed in the oxygen ambient or the mixture ambient of nitrogen and oxygen is three orders of magnitude higher than that of the transparent conductive oxide layer 106 without the passivation layer 108 thereon. This evidence shows that no matter how much the oxygen content is, the resistivity of the transparent conductive oxide layer increases during the thermal annealing process with the oxygen ambient. In other words, the resistivity of the transparent conductive oxide layer 106 deposited by ALD is sensitive to oxygen during annealing. Although the resistivity of the transparent conductive oxide layer 106 deposited on a glass substrate increases over 1000 times after annealing in an oxygen ambient, the crystallinity of the transparent conductive oxide layer 106 do not show an obvious change observed from X-ray diffraction patterns. On the other hand, it is found that the resistivity of The transparent conductive oxide layer 106 can be preserved by depositing the passivation layer 108 onto transparent conductive oxide layer 106. The transparent conductive oxide layer 106 with the passivation layer 108 thereon has a resistivity lower than that without the passivation layer 108 thereon after the thermal annealing process. The resistivity of the transparent conductive oxide layer 106 with the passivation layer 108 thereon only slightly increases with the annealing temperature. Meanwhile, the transparent conductive oxide layer 106 with the $SiO_2$ passivation layer 108 thereon exhibits a lower resistivity of $8.2 \times 10^{-4}$ Ω-cm than the transparent conductive oxide layer 106 with the $Al_2O_3$ passivation layer of $1.4 \times 10^{-3}$ Ω-cm after annealing at 500° C. in nitrogen ambient. The transparent conductive oxide layer 106 covered with the passivation layer 108 thereon can effectively avoid the increase of resistivity. The resistivity of the transparent conductive oxide layer 106 increases to $1.85 \times 10^{-1}$ Ω-cm while the carrier gas in the annealing chamber changes to 80% nitrogen and 20% oxygen filled in the annealing chamber. The resistivity of the transparent conductive oxide layer 106 is increased after RTA, especially when oxygen is added into the annealing chamber as the carrier gas. The increase of resistivity of the transparent conductive oxide layer 106 also increases the forward operating voltage of a light-emitting device while using the transparent conductive oxide layer 106 in a device structure comprising a semiconductor light-emitting structure. Thus the light emitting efficiency, which is luminous per watt, is decreased. To sum up, FIG. 2(a) shows the transparent conductive oxide layer 106 covered by the passivation layer 108 composed of either silicon oxide or aluminum oxide may reduce the increase of resistivity of the transparent conductive oxide layer 106 after RTA.

Figure 2B:
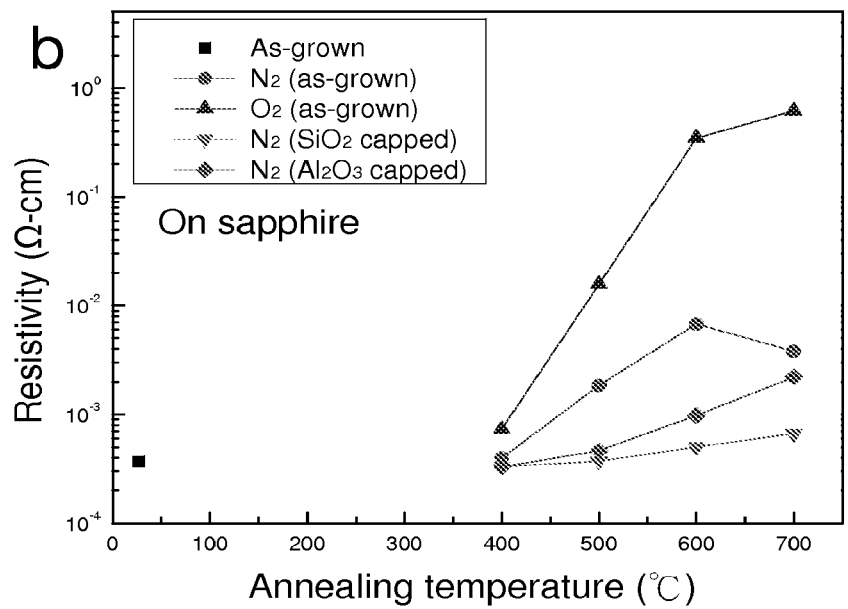

FIG. 2(b) shows the resistivity of the transparent conductive oxide layer 106 comprising GZO with and without the passivation layer 108 thereon on the base 100 composed of a sapphire substrate under various temperature and ambients. That is, different gases are used as a carrier gas in the annealing chamber including nitrogen and oxygen. The resistivity of the transparent conductive oxide layer 106 deposited on the sapphire substrate is $3.7 \times 10^4$ $\Omega$-cm, which is lower than that deposited on the glass substrate. Similar to the trend of the embodiment in FIG. 2(a), the low resistivity of the transparent conductive oxide layer 106 deposited on a sapphire substrate with a passivation layer thereon could be preserved even after RTA. The resistivity can be reduced to $3.3 \times 10^{-4}$ $\Omega$-cm capped by $SiO_2$ passivation layer and reduced to $3.29 \times 10^{-4}$ $\Omega$-cm capped by $Al_2O_3$ passivation layer after 400° C. RTA. The resistivity still keeps at $6.7 \times 10^{-4}$ $\Omega$-cm for the transparent conductive oxide layer 106 capped by $SiO_2$ passivation layer annealed at 700° C. Moreover, it can be observed that the transparent conductive oxide layer 106 has as low resistivity after the thermal annealing process as that of the transparent conductive oxide layer 106 before the thermal annealing process. Similar to FIG. 2(a), the resistivity of the transparent conductive oxide layer 106 formed on a sapphire substrate is also increased after the thermal annealing process. In an embodiment, the increase of the resistivity also increases the forward operating voltage of a light-emitting device.

Figure 3A:
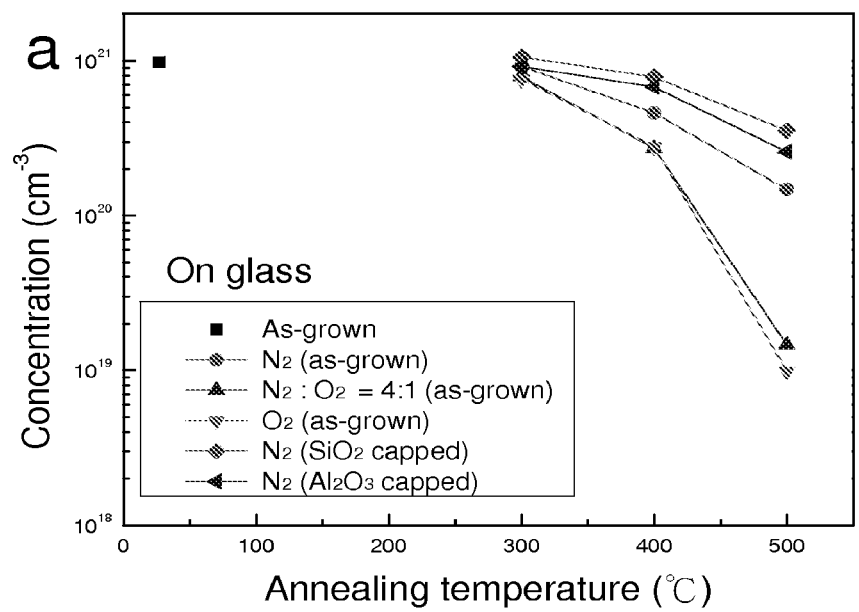
FIGS. 3(a) and 3(b) depict the impurity concentration of the transparent conductive oxide layer with and without the passivation layer thereon on different base related to the annealing temperature in various ambient in accordance with the present disclosure.
Figure 3B:
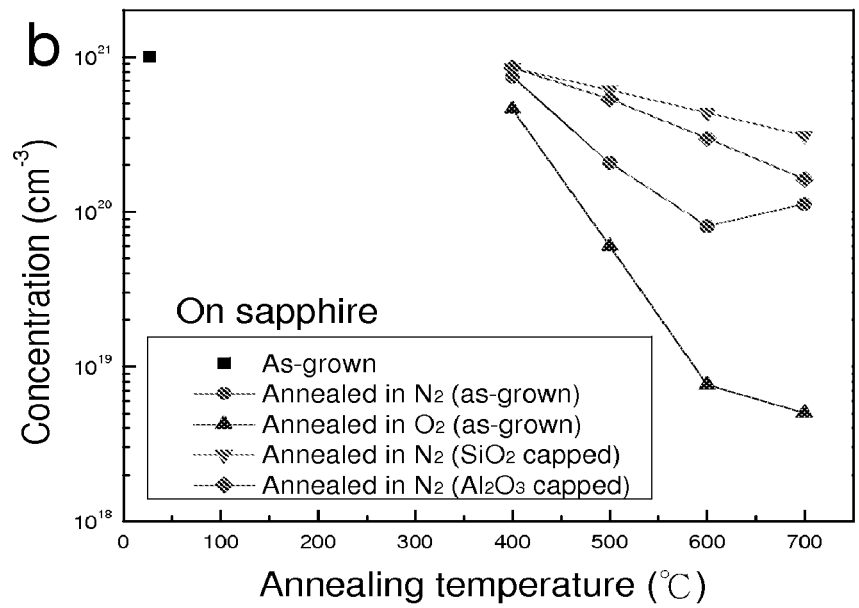

FIG. 3(a) shows the doped concentration of the doped element in the transparent conductive oxide layer 106 with or without the passivation layer thereon on the base 100 composed of a glass substrate under various temperature and ambients. That is, different gases are used as a carrier gas in the annealing chamber including nitrogen, oxygen, or the mixture of nitrogen and oxygen with a ratio of 4:1. FIG. 3(b) show the doped concentration of the doped element in the transparent conductive oxide layer 106 with or without the passivation layer thereon on the base 100 composed of a sapphire substrate under various temperature and ambients. That is, different gases are used as a carrier gas in the annealing chamber including nitrogen and oxygen. In an embodiment, the doped element in the transparent conductive oxide layer 106 induces carrier, thus the carrier concentration is related to the concentration of the doped element. The transparent conductive oxide layer 106 comprising GZO has n-type conductivity and an electron concentration of $\sim 10^{21}$ $cm^{-3}$ from Hall measurements. As shown in FIG. 3(a), the doped concentration decays during the RTA, especially in oxygen ambient. It is attributed to the bonding of gallium donors in ZnO with oxygen and the bonding of oxygen vacancies with oxygen. That is the reason the resistivity of GZO is much sensitive when GZO is annealed in oxygen ambient. When the transparent conductive oxide layer 106 is annealed in nitrogen ambient, the doped concentration in the transparent conductive oxide layer 106 also decays during annealing. It is suggested that zinc is lost or evaporated during annealing, and causes oxygen content increasing and vacancy decreasing in the transparent conductive oxide layer 106. Because of the increase of oxygen content in the transparent conductive oxide layer 106, the type of gallium oxide formed in the transparent conductive oxide layer 106 changes from GaO (Ga atoms substitute the Zn sites) to $Ga_2O_3$ due to the combination with oxygen. Then the concentration of doped element, i.e. Ga, for improving conduction of the transparent conductive oxide layer 106 is reduced, and the conduction mechanism during annealing in nitrogen ambient is degraded. As the same trend, the transparent conductive oxide layer 106 with a passivation layer 108 thereon keeps the doped concentration constant after annealing. It is suggested that the passivation layer 108 prevents zinc in the GZO from evaporating during annealing. To be more specific, no matter the transparent conductive oxide layer 106 is formed on a glass substrate depicted in FIG. 3(a) or a sapphire substrate depicted in FIG. 3(b), a passivation layer 108 comprising silicon oxide or aluminum oxide formed on the transparent conductive oxide layer 106 can reduce the decrease of the doped concentration of the transparent conductive oxide layer 106 caused by RTA.

Figure 4A:
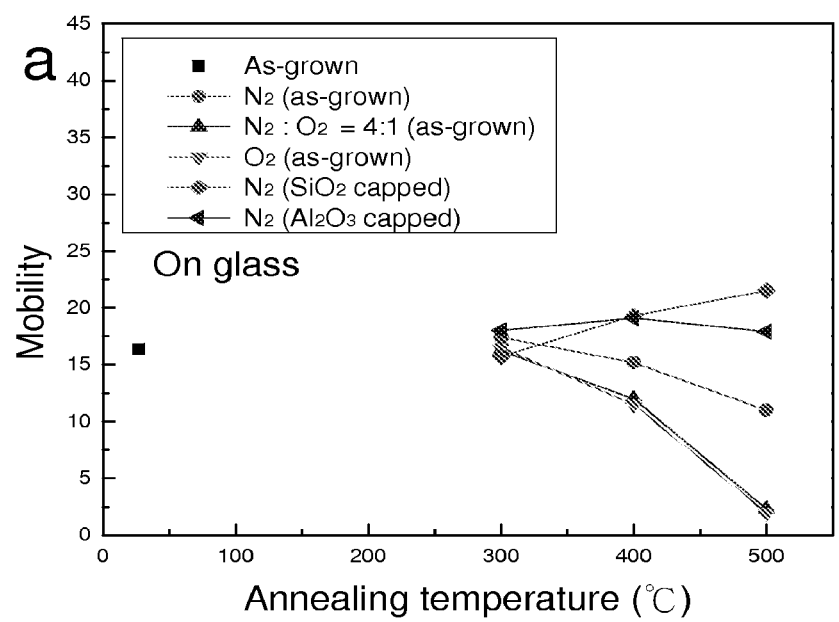
FIGS. 4(a) and 4(b) depict the mobility of the element doped in transparent conductive oxide layer with and without the passivation layer thereon on different base related to the annealing temperature in various ambient in accordance with the present disclosure.
Figure 4B:
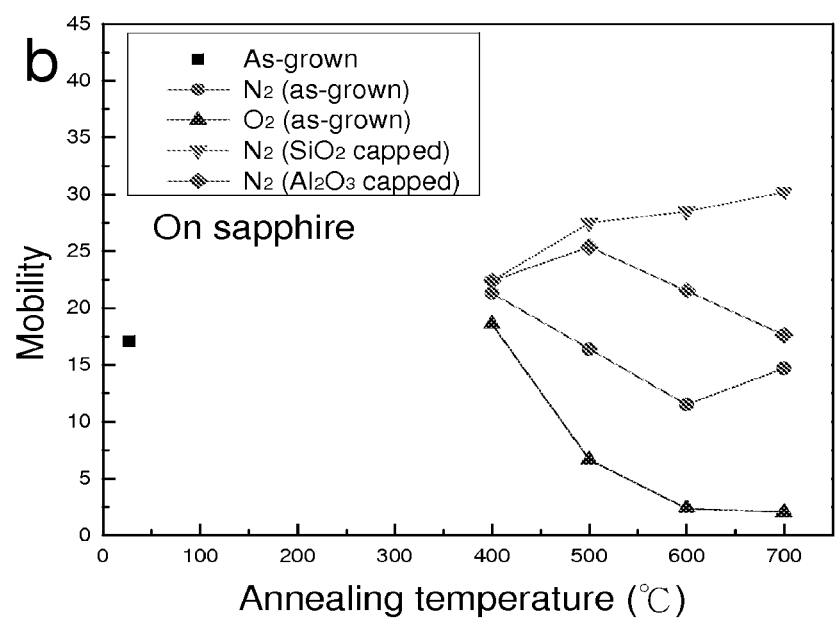

FIG. 4(a) illustrates the mobility of the doped element in the transparent conductive oxide layer 106 comprising GZO with and without the passivation layer deposited on the base 100 composed of a glass substrate under various temperature and an ambient. That is, nitrogen is used as a carrier gas in the annealing chamber. FIG. 4(b) illustrates the mobility of the doped element in the transparent conductive oxide layer 106 comprising GZO with and without the passivation layer deposited on the base 100 composed of a sapphire substrate under various temperature and ambients. That is, different gases are used as a carrier gas in the annealing chamber including nitrogen, oxygen, and the mixture of nitrogen and oxygen with a ratio of 4:1. The doped elements in the transparent conductive oxide layer 106 induces carriers thus the mobility of the doped elements indicates the mobility of the carriers in the transparent conductive oxide layer 106. The transparent conductive oxide layer 106 comprising GZO has a mobility of about 16 $cm^2$/V-sec. Referring to FIGS. 4(a)-4(b), the mobility of GZO transparent conductive oxide layer 106 deposited on a glass substrate remains almost the same value by capping the passivation layer 108 before and after RTA. However, capping $SiO_2$ passivation layer provides better protection than capping $Al_2O_3$ passivation layer. Similar to the case of the transparent conductive oxide layer 106 deposited on a glass substrate, the mobility of GZO deposited on the sapphire substrate is also enhanced with a passivation layer thereon. For the transparent conductive oxide layer 106 annealed at 700° C., the mobility keeps at 17.6 $cm^2$/V-sec by $Al_2O_3$ passivation layer, and enhances to 30.2 $cm^2$/V-sec by $SiO_2$ passivation layer, as shown in FIG. 4(b). The mobility of the transparent conductive oxide layer 106 deposited on the sapphire substrate is higher than that of the transparent conductive oxide layer 106 deposited on the glass substrate, which is resulted from the sapphire substrate being crystal-oriented and thus improves the film quality. To compared with the transparent conductive oxide layer 106 formed on the base 100 composed of different materials in FIGS. 4(a) and 4(b), mobilities of the transparent conductive oxide layer 106 are all decreased after RTA though the amount of the decrease are different due to the different materials of the base 100. Besides, the passivation layer 108 formed on the transparent conductive oxide layer 106 in FIGS. 4(a) and 4(b) prevents the decrease of the mobility of the transparent conductive oxide layer 106 and increases the mobility of the transparent conductive oxide layer 106 under some circumstances after the thermal annealing process.

Figure 5A:
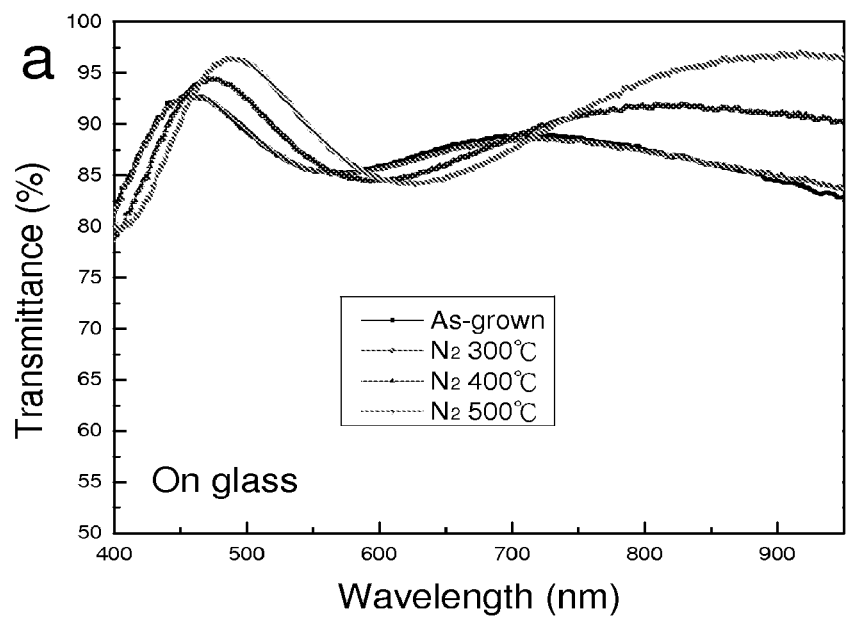
FIGS. 5(a)-5(b) depict the transmittance spectra of the transparent conductive oxide layer without the passivation layer thereon.

FIG. 5(a) shows the transmittance spectra of the transparent conductive oxide layer 106 comprising GZO deposited on the base 100 composed of a glass substrate and annealed at various temperatures in the nitrogen ambient. As shown in FIG. 5(a), the maximum transmittance of the transparent conductive oxide layer 106 occurs at 92.9% at 455 nm and 89% at 710 nm, and the wavelength of the maximum transmittance shifts toward greater wavelength (i.e. red-shift) and the intensity increases as the annealing temperature is increased. The transmittance increases in the longer wavelength range which is different from the transmittance decreasing in the longer wavelength range of the transparent conductive oxide layer 106 without passivation formed above. Furthermore, the transmittance is enhanced in the longer wavelength range after the thermal annealing process. The transmittance of wavelength at 900 nm raises from 84.4% to 84.9%, 91%, and 96.7% by the annealing temperature of 300° C., 400° C., and 500° C., respectively. As shown in FIG. 5(a), the wavelength spectra of the transparent conductive oxide layer 106 deposited on the base 100 composed of a glass substrate shifts after 500° C. of RTA with nitrogen as a carrier gas in the annealing chamber.

Figure 5B:
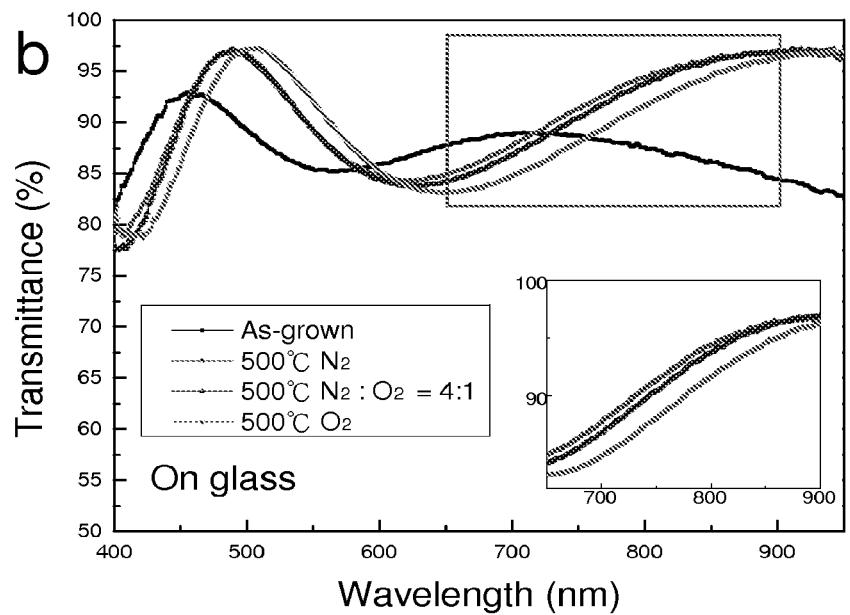

FIG. 5(b) shows the transmittance spectra of the transparent conductive oxide layer 106 deposited on the base 100 composed of a glass substrate and annealed at 500° C. in the various ambients. Similarly, the maximum transmittance shifts to longer wavelength, i.e. red-shift, while more oxygen flows to the annealing chamber. This suggests that the maximum transmittance is dependent on the annealing temperature only, while the wavelength of maximum transmittance is dependent on the annealing temperature and the ambient, i.e. the carrier gas in the annealing chamber. Referring to FIG. 5(b), the transmittance of the transparent conductive oxide layer 106 larger than 95% is in a range of wavelength between 450-550 nm. In comparison with the transmittance spectra changing of the transparent conductive oxide layer 106 under different RTA conditions, the composition of carrier gas affects the transmittance spectra and also causes the wavelength shift. To be more specific, more oxygen added in the carrier gas induces more wavelength spectra shift of the transparent conductive oxide layer.

Figure 5C:
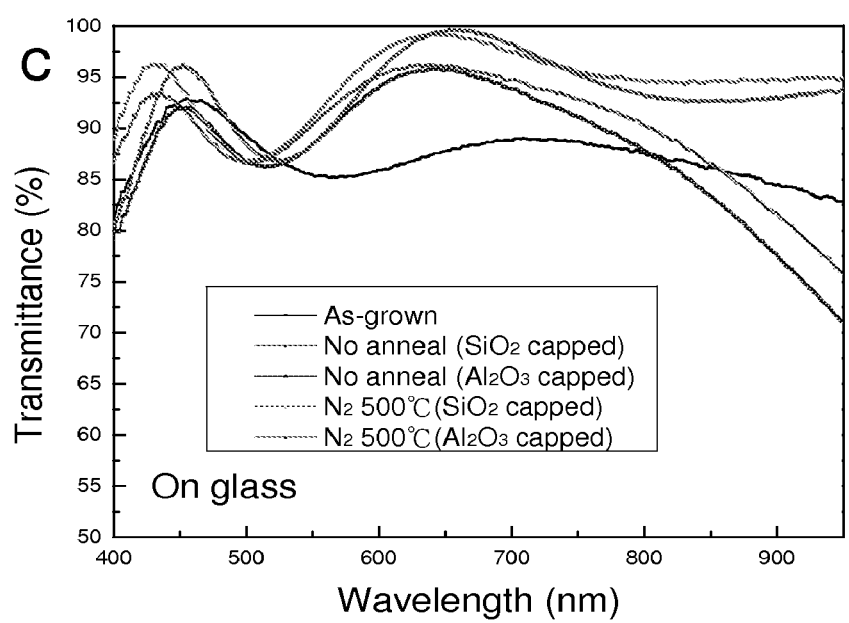
FIG. 5(c) depicts the transmittance spectra of the transparent conductive oxide layer with the passivation layer thereon related to the wavelength in various ambient in accordance with the present disclosure.

The wavelength of maximum transmittance in the blue or red range can be modulated by controlling the thickness of the passivation layer as an anti-reflective coating layer. FIG. 5(c) shows the effects of the annealing temperature and ambient gas during the thermal annealing process on the transmittance spectra of the transparent conductive oxide layer 106 comprising GZO with and without the passivation layer 108 deposited on the base 100 composed of a glass substrate. The maximum transmittance of the transparent conductive oxide layer 106 is 92.9% at wavelength of 455 nm and 89% at 710 nm before annealing. After the thermal annealing process, the maximum transmittance of the transparent conductive oxide layer 106 is not only kept in the fixed wavelength range but also enhanced in the blue and red ranges. The maximum transmittance of the transparent conductive oxide layer 106 with the passivation layer 108 is improved to 99.6% at wavelength of 659 nm when capping a $Al_2O_3$ passivation layer and improved to 99.2% at wavelength of 649 nm when capping a $SiO_2$ passivation layer, wherein the improvements are at wavelengths in the red light range. Besides, the transmittance is improved to 96.2% at 452 nm when capping a $Al_2O_3$ passivation layer, and improved to 96.3% at 430 nm when capping a $SiO_2$ passivation layer, wherein the improvements are at wavelengths in the blue light range. Addition of the passivation layer and suitable annealing process significantly improve both the electrical and optical characteristics of the transparent conductive oxide layer, which are beneficial to the applications for optoelectronic devices. To be more specific, FIG. 5(c) describes the transmittance spectra of the transparent conductive oxide layer 106 with and without a passivation layer. FIG. 5(c) shows the increase of the transmittance while the passivation layer is formed on the transparent conductive oxide layer 106.

The disclosure presented above have demonstrated the effects of the passivation layer and the thermal annealing process on the transparent conductive oxide layer comprising Ga-doped ZnO grown by thermal-ALD with using $H_2O$ as oxidant source. The transparent conductive oxide layer 106 have the resistivity of $3.9 \times 10^{-4}$ Ω-cm grown on a glass substrate and $3.7 \times 10^{-4}$ Ω-cm grown on a sapphire substrate. The resistivity and transmittance of the transparent conductive oxide layer 106 increase after the thermal annealing process. The resistivity of the transparent conductive oxide layer is sensitive to oxygen during annealing, and increases from $10^4$ to $10^{-1}$ Ω-cm during the thermal annealing process in the oxygen ambient. Using aluminium oxide or silicon dioxide as a passivation layer on the transparent conductive oxide layer 106 is able to preserve the low resistivity of $\sim 3.3 \times 10^4$ Ω-cm at a 400° C. RTA process. The maximum transmittance rises from 92.9% at 455 nm for the transparent conductive oxide layer to 96.5% at 486 nm at a 500° C. RTA process in the nitrogen ambient. With the passivation layer, the maximum transmittance of GZO would improve to ~99% in red light range, and ~96% in blue light range after the thermal annealing process. Addition of the passivation layer and suitable annealing process would significantly improve both the electrical and optical characteristics of the transparent conductive oxide layer, which are beneficial to the applications for optoelectronic devices. With the disclosure presented above, the passivation layers used to preserve the optical and electrical characteristics of the transparent conductive oxide layer decay after annealing or even enhance the transmittance and mobility. Since the transparent conductive oxide layer is used as a light extracting layer, it is suitable to apply the transparent conductive structure to a light-emitting device to enhance the optical and electrical characteristic.

Figure 6D:
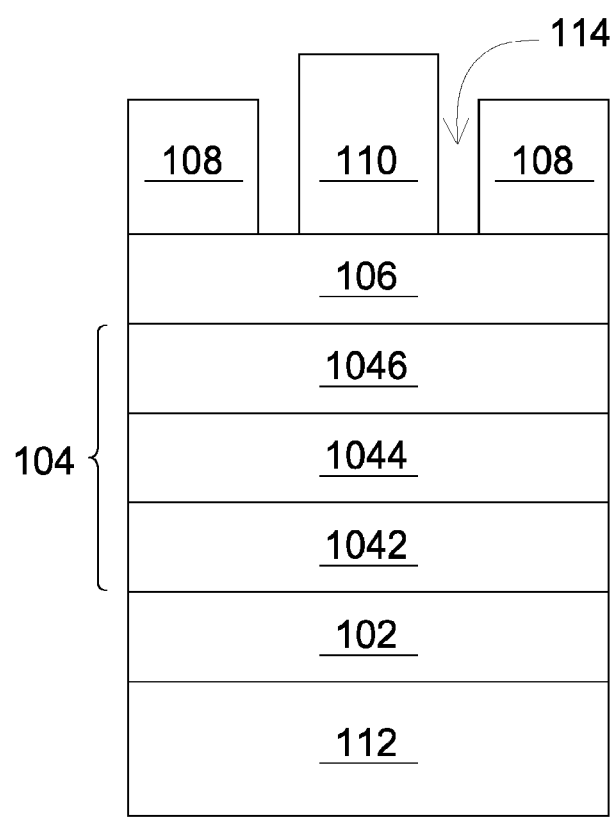

FIGS. 6(a)-6(d) show an embodiment of a method for forming a light-emitting device 10 in accordance with one embodiment of the present disclosure. The method comprises steps of providing a substrate 102 as shown in FIG. 6(a), epitaxially growing a first semiconductor layer 1042 of a first conductivity-type on the substrate 102, epitaxially growing an active layer 1044 having multi-quantum wells on the first semiconductor layer 1042 for emitting an incoherent light, and epitaxially growing a second semiconductor layer 1046 of a second conductivity-type on the active layer 1044 to form a light-emitting stack 104 as shown in FIG. 6(b). The first semiconductor layer 1042 and the second semiconductor layer 1046 has different conductivity types, e.g. the first semiconductor layer 1042 can be an n-type semiconductor layer and the second semiconductor layer 1046 can be a p-type semiconductor layer. A transparent conductive oxide layer 106 is then deposited on the light-emitting stack 104 and a passivation layer 108 is then formed on the transparent conductive oxide layer 106 as shown in the FIG. 6(c). The method of manufacturing and the properties of the transparent conductive oxide layer 106 and the passivation layer 108 are as the foregoing embodiments from FIG. 1 to FIG. 5(c). The method of forming the transparent conductive oxide layer 106 comprising providing a metal to form a metal oxide and providing an element as an impurity for doping. The metal oxide comprises zinc oxide and the impurity comprises gallium. Moreover, the step of forming the transparent conductive oxide layer 106 comprises changing the concentration of the gas injected during forming the transparent conductive oxide layer 106. To be more specific, injecting the impurity at a first concentration into the transparent conductive oxide layer 106 while forming a first portion of the transparent conductive oxide layer 106 and injecting the impurity at a second concentration into the transparent conductive oxide layer 106 while forming a second portion of the transparent conductive oxide layer 106. Besides, a concentration ratio between the impurity provided and the metal of the metal oxide provided to form transparent conductive oxide layer 106 is larger than 3%. To be more specific, the ratio is between 5%~20%.

Figure 7:
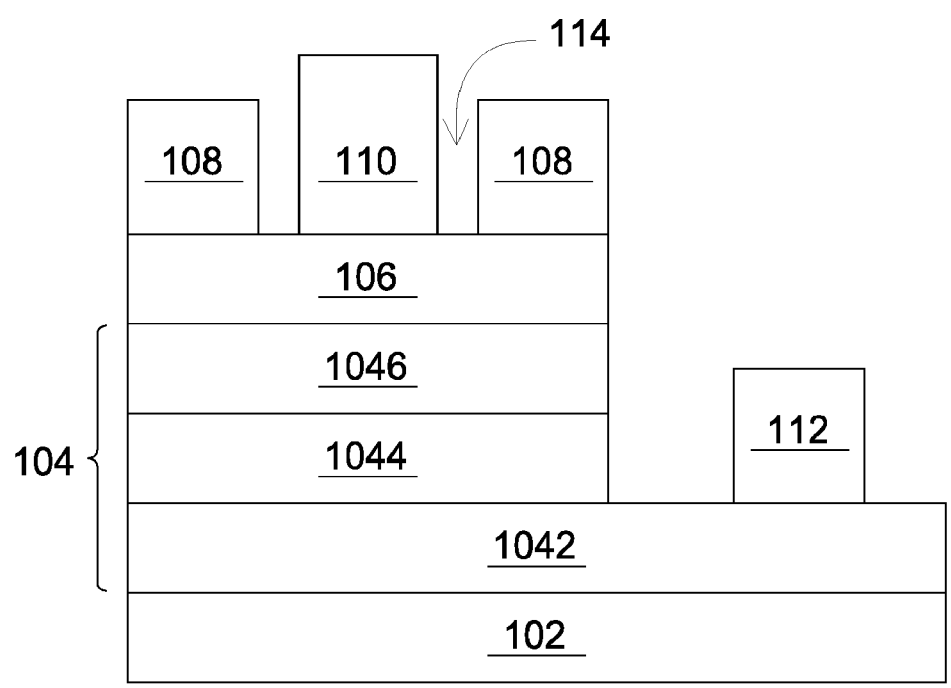
FIG. 7 shows an embodiment in accordance with the present disclosure.

Referring to the FIG. 6 (d), a recess 114 is formed in the passivation layer 108 to expose a part of the transparent conductive oxide layer 106, and a first electrode pad 110 is then formed on the exposed transparent conductive oxide layer 106. A second electrode pad 112 is formed on a side of the substrate 102 opposing to the light-emitting stack 104. A thermal annealing process is performed on the light-emitting device 10, and a vertical-type light-emitting device as shown in FIG. 6(d) is formed. In another embodiment, the thermal annealing process is performed after the passivation layer 108 is formed and before forming the electrode pad is formed. The detail of the thermal annealing process are disclosed as the foregoing embodiments from FIG. 1 to FIG. 5(c). FIG. 7 shows a horizontal-type light-emitting device 11 in accordance with an embodiment of this application. The light-emitting stack 104 is etched to exposed a part of the first semiconductor layer 1042, and the second electrode pad 112 is formed on the exposed part of the first semiconductor layer 1042.

Figure 8:
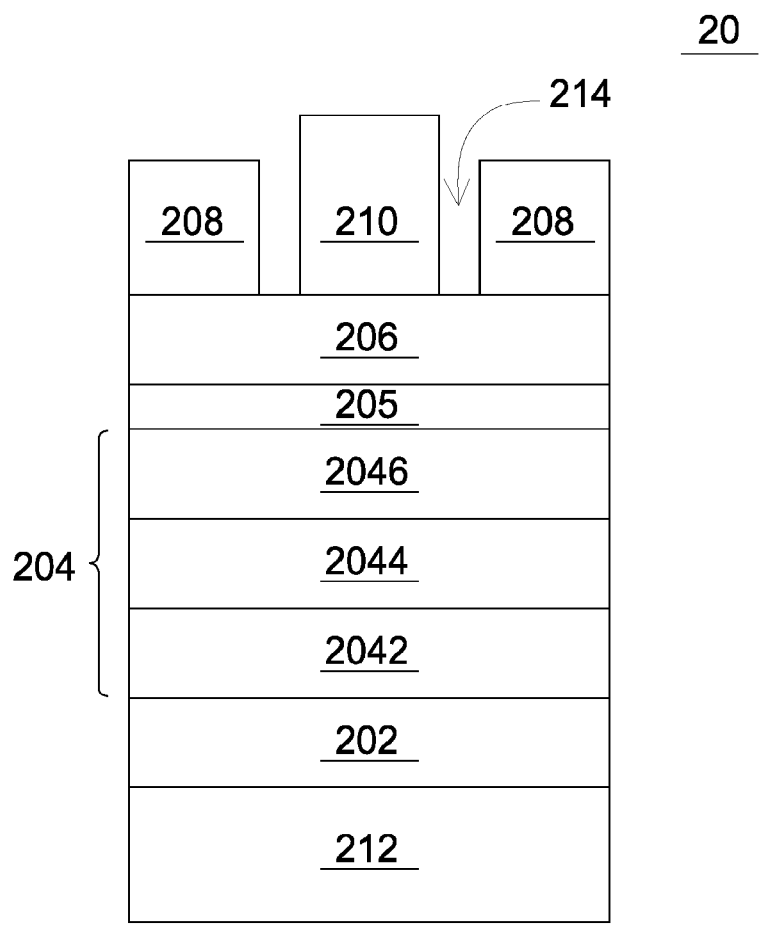
FIG. 8 shows an embodiment in accordance with the present disclosure.

In another embodiment, a transparent conductive layer is adopted to enhance the conductivity. Referring to FIG. 8, the light emitting device 20 comprises a first semiconductor layer 2042 of a first conductivity-type on the substrate 202, an active layer 2044 on the first semiconductor layer 2042 for emitting an incoherent light, and a second semiconductor layer 2046 of a second conductivity-type on the active layer 2044 to form a light-emitting stack 204. The first semiconductor layer 2042 and the second semiconductor layer 2046 has different conductivity type, e.g. the first semiconductor layer 2042 can be an n-type semiconductor layer and the second semiconductor layer 2046 can be a p-type semiconductor layer. The transparent conductive layer 205 is formed on the second semiconductor layer 2046 and the material of the transparent conductive layer 205 comprises indium tin oxide (ITO). The ITO used in the transparent conductive layer 205 comprises a tin of tetravalent state and an indium of trivalent state, and the mole fraction of the tin is less than 15%. In another embodiment, the mole fraction of tin in ITO is between 1%~10%. The two metal elements used in the transparent conductive layer 205 are of different valence state. To be more specific, tin is an element of the group IVA and indium is an element of group IIIA wherein the two different groups are next to each other. A transparent conductive oxide layer 206 is formed on the transparent conductive layer 205 and a passivation layer 208 is formed on the transparent conductive oxide layer 206. In this embodiment, the material of the transparent conductive oxide layer 206 comprises GZO. The GZO used in the transparent conductive oxide layer 206 comprises a zinc of bivalent state and a gallium of trivalent state, and the mole fraction of the gallium is less than 10%. In an embodiment, the concentration of the gallium can be 1%~5%. The two metal elements used in the transparent conductive oxide layer 206 are of different valence state. To be more specific, zinc is an element of the group IIB and gallium is an element of group IIIA wherein the two different groups are next to each other. In comparison with the transparent conductive layer 205 and the transparent conductive oxide layer 206, the two layers comprise metal elements of a group (indium of the transparent conductive layer 205 and gallium of the transparent conductive oxide layer 206) and metal elements have different valence state (tin of tetravalent state in the transparent conductive layer 205 and zinc of bivalent state in the transparent conductive oxide layer 206). A recess 214 is formed in the passivation layer 208 to expose a part of the transparent conductive oxide layer 206, and a first electrode pad 210 is then formed on the exposed transparent conductive oxide layer 206. A second electrode 212 is formed on a side of the substrate 202 opposing to the light-emitting stack 204.

Figure 9:
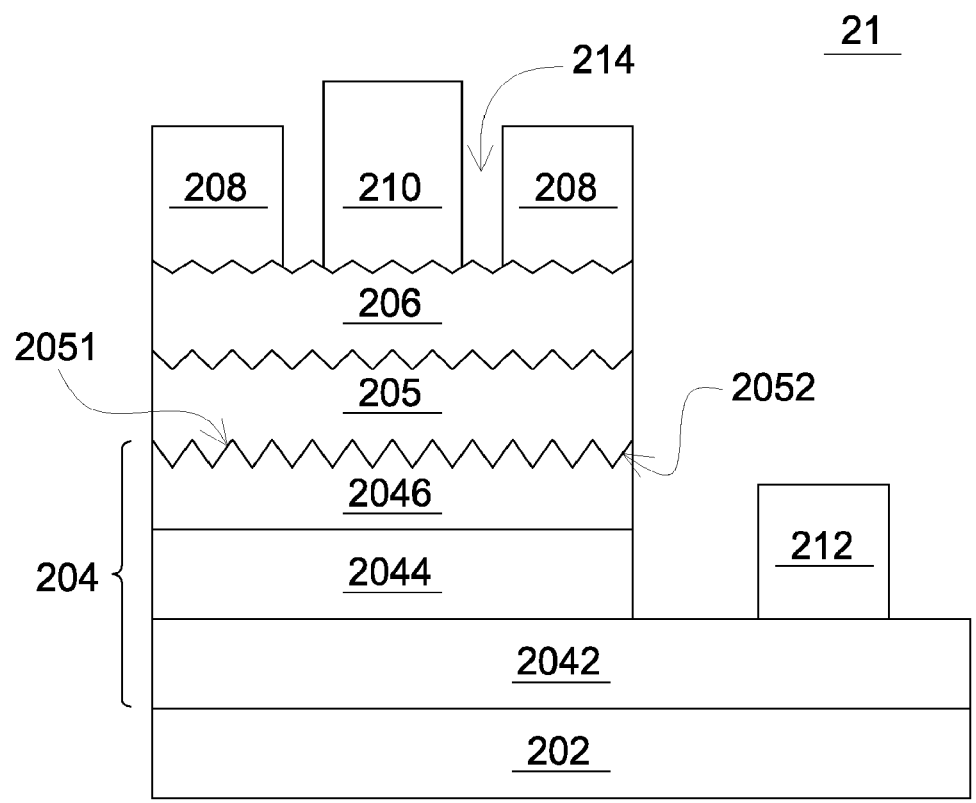
FIG. 9 shows an embodiment in accordance with the present disclosure.

Referring to FIG. 9, a horizontal-type light-emitting device 21 in accordance with one embodiment of the present disclosure comprises a substrate 202, a light-emitting stack 204, a transparent conductive layer 205, a transparent conductive oxide layer 206, a passivation layer 208, a first electrode pad 210 and a second electrode pad 212. The light-emitting stack 204 comprises a first semiconductor layer 2042, an active layer 2044, and a second semiconductor layer 2046. In this embodiment, the light-emitting stack 204 is etched to expose a part of the first semiconductor layer 2042 wherein the second electrode pad 212 is formed on the exposed part of the first semiconductor layer 2042. Moreover, the second semiconductor layer 2046 is etched to form a plurality of hexagonal-pyramid cavities 2052. Thus, convexes and concaves are formed on the top surface 2051 of the second semiconductor layer 2046. Besides, the hexagonal-pyramid cavities 2052 are extended downward from the top surface 2051 so each of the transparent conductive layer 205 formed on the second semiconductor layer 2046 and the transparent conductive oxide layer 206 formed on the transparent conductive layer 205 has a concave-convex surface. A recess 214 is formed in the passivation layer 108 to expose a part of the transparent conductive oxide layer 206, and a first electrode pad 210 is then formed on the exposed part of the transparent conductive oxide layer 206.

It will be apparent to those having ordinary skill in the art that various modifications and variations can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

What is claimed is:

1. A method of manufacturing a transparent conductive structure, comprising:
    forming a transparent conductive layer by sequentially injecting a first precursor and a second precursor at a first temperature, the transparent conductive layer having a first resistivity;
    providing a passivation layer directly connected to the transparent conductive layer; and
    applying a thermal treatment to the transparent conductive layer and the passivation layer at a second temperature higher than the first temperature,
    wherein the transparent conductive layer and the passivation layer collectively have a first transmittance before the thermal treatment and a second transmittance after the thermal treatment, wherein the transparent conductive layer has a second resistivity higher than the first resistivity after the thermal treatment.

2. The method of claim 1, wherein the first precursor and the second precursor comprise $H_2O$, Diethylzinc (DEZ) or triethylgallium (TEG).

3. The method of claim 1, further comprising a step of pausing for a time between injecting the first precursor and the second precursor.

4. The method of claim 1, further comprising a step of injecting a purge gas after injecting the first precursor and the second precursor.

5. The method of claim 1, further comprising a step of injecting a third precursor after injecting the first precursor.

6. The method of claim 5, wherein the third precursor has an injection cycle fewer than that of the second precursor.

7. The method of claim 1, wherein the second transmittance is higher than the first transmittance for a light with a wavelength between 400 nm and 500 nm or above 550 nm.

8. The method of claim 1, wherein the second transmittance is larger than 97% in a blue light range when the transparent conductive layer is placed on a glass.

9. The method of claim 1, wherein the second transmittance is larger than 95% in a red light range when the transparent conductive layer is placed on a glass.

10. The method of claim 1, wherein the first transmittance has a first maximum value at a first wavelength, the second transmittance has a second maximum value at a second wavelength, the first wavelength and the second wavelength have a difference of less than 10 nm.

11. The method of claim 1, wherein the transparent conductive layer comprises zinc oxide doped with a group IIIA element, a mole fraction of the group IIIA element is less than 10%.

12. The method of claim 1, wherein the passivation layer comprises aluminum oxide or silicon oxide.

13. A method of manufacturing a light-emitting device, comprising:

providing a semiconductor structure;

forming a transparent conductive layer on the semiconductor structure by injecting a first precursor and a second precursor at a first temperature, the transparent conductive layer having a first resistivity;

providing a passivation layer directly connected to the transparent conductive layer; and applying a thermal treatment at a second temperature higher than the first temperature, wherein the transparent conductive layer and the passivation layer collectively have a first transmittance before the thermal treatment and a second transmittance after the thermal treatment, wherein the transparent conductive layer has a second resistivity higher than or similar the first resistivity after the thermal treatment.

14. The method of claim 13, wherein the first precursor and the second precursor comprise $H_2O$, Diethylzinc (DEZ) or triethylgallium (TEG).

15. The method of claim 13, wherein the second transmittance is higher than the first transmittance.

16. The method of claim 13, wherein the first transmittance has a first maximum value at a first wavelength, the second transmittance has a second maximum value at a second wavelength, the first wavelength and the second wavelength have a difference of less than 10 nm.

17. The method of claim 13, wherein the semiconductor structure comprises a first semiconductor layer, an active layer, and a second semiconductor layer.

18. The method of claim 13, wherein the transparent conductive layer comprises zinc oxide doped with group IIIA element, a mole fraction of the group IIIA element is less than 10%.

19. The method of claim 13, wherein the passivation layer comprises aluminum oxide or silicon oxide.

20. The method of claim 13, further comprising a step of providing a conductive layer sandwiched by the transparent conductive layer and the semiconductive structure.

* * * * *